United States Patent
Han et al.

(10) Patent No.: US 10,396,300 B2
(45) Date of Patent: Aug. 27, 2019

(54) CARBON NANOTUBE DEVICE WITH N-TYPE END-BONDED METAL CONTACTS

(71) Applicant: International Business Machines Corporation, Armonk, NY (US)

(72) Inventors: Shu-Jen Han, Cortlandt Manor, NY (US); Jianshi Tang, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/957,664

(22) Filed: Dec. 3, 2015

(65) Prior Publication Data

US 2017/0162806 A1 Jun. 8, 2017

(51) Int. Cl.
| | | |
|---|---|---|
| B82Y 10/00 | (2011.01) | |
| H01L 51/10 | (2006.01) | |
| H01L 51/00 | (2006.01) | |
| H01L 27/28 | (2006.01) | |
| H01L 51/05 | (2006.01) | |

(52) U.S. Cl.
CPC .......... H01L 51/105 (2013.01); H01L 27/288 (2013.01); H01L 51/0048 (2013.01); *H01L 51/0017* (2013.01); *H01L 51/0545* (2013.01)

(58) Field of Classification Search
CPC ... B82Y 10/00; B82Y 35/00; H01L 21/28587; H01L 21/823437; H01L 21/823456; H01L 29/66598; H01L 29/78618; H01L 29/0669; H01L 2029/41; H01L 2029/78618; H01L 2224/29015; H01L 51/0048; H01L 51/105; H01L 51/0017; H01L 51/0045; H01L 2221/1094; H01L 51/057; H01L 2224/05393; H01L 2224/05493; H01L 21/02601–21/02606; Y10S 977/742;
(Continued)

(56) References Cited

U.S. PATENT DOCUMENTS

| | | |
|---|---|---|
| 6,723,624 B2 | 4/2004 | Wang et al. |
| 6,891,227 B2 | 5/2005 | Appenzeller et al. |
(Continued)

OTHER PUBLICATIONS

Choi et al. Comparative study of thermally cured and electron-beam-exposed hydrogen silsesquioxane resists. Journal of Vacuum Science &Technology B: Microelectronics and Nanometer Structures Processing, Measurement, and Phenomena 26, 1654 (2008).*
(Continued)

*Primary Examiner* — Eric A. Ward
*Assistant Examiner* — Eric K Ashbahian
(74) *Attorney, Agent, or Firm* — Fleit Gibbons Bongini Bianco PL; Thomas S. Grzesik (57) ABSTRACT

A field effect transistor includes a substrate and a gate dielectric formed on the substrate. A channel material is formed on the gate dielectric. The channel material includes carbon nanotubes. A patterned resist layer has openings formed therein. The openings expose portions of the gate dielectric and end portions of the channel material under the patterned resist layer. Metal contacts are formed at least within the openings. The metal contacts include a portion that contacts the end portions of the channel material and the portions of the gate dielectric exposed within the openings.

18 Claims, 8 Drawing Sheets

(58) Field of Classification Search
CPC . Y10S 977/842; C01B 2204/06; C07F 7/1804
See application file for complete search history.

(56) References Cited

U.S. PATENT DOCUMENTS

| | | | |
|---|---|---|---|
| 7,598,516 B2 | 10/2009 | Avouris et al. | |
| 8,404,539 B2 | 3/2013 | Chang et al. | |
| 8,471,249 B2 | 6/2013 | Chiu et al. | |
| 8,536,018 B1* | 9/2013 | Anderson | H01L 21/76283 257/E21.564 |
| 2005/0167673 A1* | 8/2005 | Maegawa | H01L 29/41733 257/72 |
| 2006/0081886 A1* | 4/2006 | Mostarshed | B82Y 10/00 257/213 |
| 2006/0223243 A1 | 10/2006 | Radosavljevic et al. | |
| 2008/0100762 A1* | 5/2008 | Onogi | G02F 1/134363 349/39 |
| 2010/0304101 A1* | 12/2010 | Lin | B82Y 30/00 428/212 |
| 2011/0062419 A1* | 3/2011 | Kikuchi | B82Y 10/00 257/24 |
| 2013/0143356 A1* | 6/2013 | Afzali-Ardakani | H01L 51/002 438/99 |
| 2013/0243947 A1* | 9/2013 | Yang | B05D 3/007 427/156 |
| 2013/0299883 A1* | 11/2013 | Lin | H01L 29/66969 257/288 |
| 2016/0172596 A1* | 6/2016 | Rutherglen | H01L 51/0023 257/9 |

OTHER PUBLICATIONS

Franklin, A.D., et al., "Defining and Overcoming the Contact Resistance Challenge in Scaled Carbon Nanotube Transistors", American Chemical Society Nano, Jul. 2, 2014, pp. 1-7, vol. 8, No. 7.

Lee, J.O., et al., "Formation of low-resistance ohmic contacts between carbon nanotube and metal electrodes by a rapid thermal annealing method", Journal of Physics D: Applied Physics, Jun. 1, 2000, pp. 1-4, vol. 33, No. 16.

U.S. Appl. No. 14/933,339, filed Nov. 5, 2015.

U.S. Appl. No. 14/929,099, filed Oct. 30, 2015.

Cao, Q., et al., "End-bonded contacts for carbon nanotube transistors with low, size-independent resistance", Science, Oct. 2, 2015, pp. 1-6, vol. 350, Issue 6256.

Zhang, Y., et al., "Heterostructures of Single-Walled Carbon Nanotubes and Carbide Nanorods", Science, Sep. 10, 1999, pp. 1-5, vol. 285.

* cited by examiner

CARBON NANOTUBE DEVICE WITH N-TYPE END-BONDED METAL CONTACTS

BACKGROUND

The present disclosure generally relates to semiconductor devices, and more particularly relates to carbon nanotube devices with end-bonded metal contacts.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field-effect-transistors (NFET) and p-type field effect transistors (PFET) are two types of complementary MOSFETs. The NFET uses electrons as the current carriers and is built with n-doped source and drain junctions. The PFET uses holes as the current carriers and is built with p-doped source and drain junctions.

The evolution of modern complementary metal-oxide semiconductor (CMOS) technology continuously scales down not only the device channel length but also the contact length. As the channel length reaches tens of nanometers, the contact resistance becomes comparable with the channel resistance, and hence gradually limits the transistor drive current.

BRIEF SUMMARY

In one embodiment, a field effect transistor is disclosed. The field effect transistor comprises a substrate and a gate dielectric formed on the substrate. A channel material is formed on the gate dielectric. The channel material comprises carbon nanotubes. A patterned resist layer has openings formed therein. The openings expose portions of the gate dielectric and end portions of the channel material under the patterned resist layer. Metal contacts are formed at least within the openings. The metal contacts comprise a portion that contacts the end portions of the channel material and the portions of the gate dielectric exposed within the openings.

In another embodiment, a field effect transistor is disclosed. The field effect transistor comprises a semiconductor substrate and a gate dielectric formed on the substrate. Carbon nanotubes are formed on the gate dielectric. The carbon nanotubes form a channel. A patterned resist layer is formed over and in contact with the carbon nanotubes. The patterned resist comprises openings formed therein, the openings exposing portions of the gate dielectric and end portions of the carbon nanotubes situated under the patterned resist layer. N-type metal contacts are formed at least within the openings. The n-type metal contacts comprise a portion that contacts the end portions of the carbon nanotubes and the portions of the gate dielectric exposed within the openings. A dielectric material is patterned over the n-type metal contacts and the patterned resist layer. The dielectric material comprises contact widows exposing at least a portion of the n-type metal contacts.

In yet another embodiment, a method for forming a field effect transistor is disclosed. The method comprises forming a gate dielectric on a semiconductor substrate. Carbon nanotubes are aligned on the gate dielectric. A resist layer is patterned to form openings therein. The openings expose a portion of the carbon nanotubes. The portion of the nanotubes exposed within the openings is etched. The etching exposes end portions of the carbon nanotubes under the resist layer and portions of the gate dielectric.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

As discussed above, the evolution of modern complementary metal-oxide semiconductor (CMOS) technology continuously scales down not only the device channel length but also the contact length. As the channel length reaches tens of nanometers, the contact resistance can become comparable with the channel resistance, and gradually limit the transistor drive current. Among all the candidate materials for post-silicon era, carbon nanotubes (CNTs) have intrinsic ultra-thin body and exceptional electrical properties (high on current, superior current on/off ratio, long mean-free-path for ballistic transport), which make them one of the most promising candidates for sub-10 nm technology node in semiconductor industry. Because of its ultrathin body nature, conventional contacts to CNT devices are usually side contacts made by directly depositing metal on top of CNTs. Such side contacts have unfavorable contact length scaling characteristics: in the case of typical Pd contact, the contact resistance increases dramatically as the contact length goes below 100 nm. In the implementation of future CNT-based CMOS technology, end-bonded metal contacts are highly desired, in which the contact resistance is theoretically independent of the contact length. While p-type end-bonded contacts have been demonstrated using various approaches in literature, devices comprising n-type end-bonded contacts to CNT and their associated fabrication methods are lacking in the industry.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Figure 1:
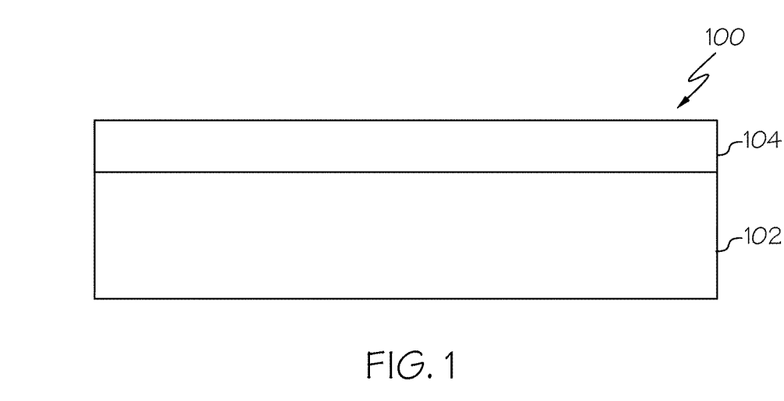
FIG. 1 is a cross-sectional view for a semiconductor device showing a dielectric layer (gate dielectric) formed on a highly doped substrate (gate electrode) according to one embodiment of the present disclosure.

Referring now to the drawings in which like numerals represent the same of similar elements, FIG. 1 illustrates a partially fabricated semiconductor device 100 is shown in accordance with the present principles. In one embodiment, the device 100 comprises a substrate 102. The substrate 102, in one embodiment, comprises a silicon (Si) substrate; however, any suitable substrate can also be employed. For example, the substrate 102 can comprise Si, SiGe (silicon germanium), Ge, III-V materials, etc. A dielectric layer 104 is deposited on the substrate 102. The dielectric layer 104, in one embodiment, a grown oxide, a deposited oxide, a deposited nitride, or other suitable dielectric material. If a deposited oxide is employed, the deposited oxide comprises a high-k dielectric material. However, other dielectric materials can also be employed as well. The dielectric layer 104 is employed as a gate dielectric for the substrate 102, which functions as a gate electrode in the completed device. The substrate 102 is highly doped to provide conditions for applying a voltage to carbon nanotubes (CNTs) as a gate electrode, as will be discussed.

Figure 2:
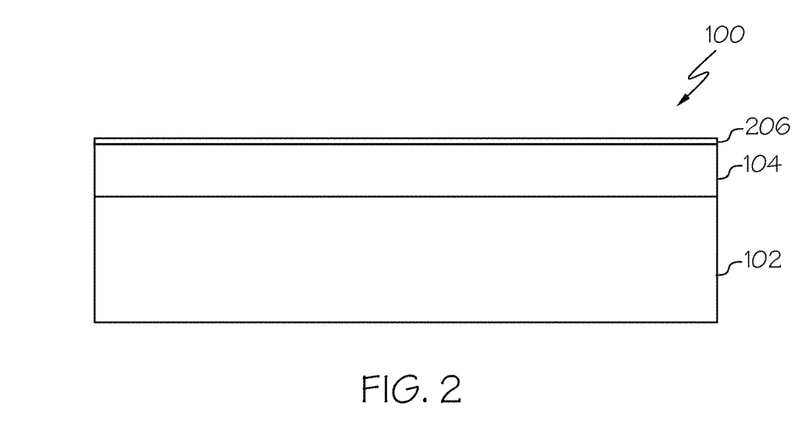
FIG. 2 is a cross-sectional view for the semiconductor device of FIG. 1 showing carbon nanotubes (CNT) aligned on the dielectric layer to form a device channel for a field effect transistor (FET) device to be formed according to one embodiment of the present disclosure.

In FIG. 2, highly purified CNTs 206 are aligned on the dielectric layer 104. In this embodiment, the alignment of the CNTs 206 comprises placing the CNTs 206 on the dielectric layer 104 or forming the CNTs 206 on the dielectric layer 104. However, any suitable placement method or growth method can be employed to provide the CNTs 206. One approach to control the placement/alignment of CNTs 206 is to control sites from which nanotubes are grown by patterning catalyst particles on the dielectric layer 104. Patterned growth using a catalyst patterned on silicon dioxide (SiO2) or Si wafers can provide location control with chemical vapor deposition (CVD) growth of nanotubes from the catalyst islands.

Single catalyst-nanoparticle patterning can include the formation of arrays of regularly spaced catalyst (e.g., iron (Fe) or cobalt (Co)) nanoparticles on SiO2/Si (layer 104/ substrate 102) by high-resolution electron-beam (e-beam) lithography (EBL). In other embodiments, formed CNTs 206 are stretched across the dielectric layer 104 as a CNTs sheet. The CNT sheet can later be patterned as needed. Other suitable processes may be employed to form CNTs 206 on the dielectric layer 104.

Figure 3:
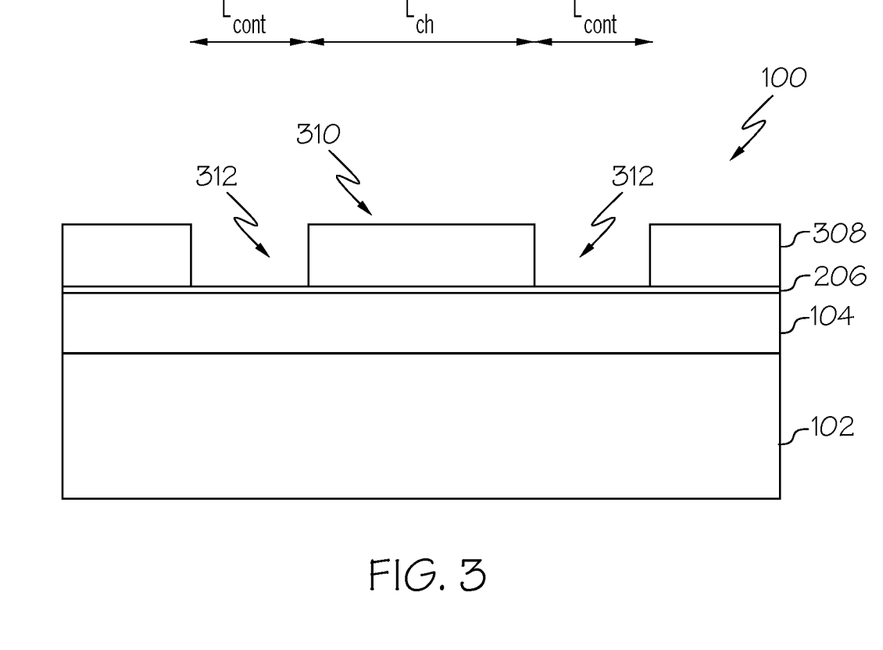
FIG. 3 is a cross-sectional view for the semiconductor device of FIG. 2 showing a patterned resist layer formed on the carbon nanotubes and having openings formed therein to locate metal contacts (source and drain regions) according to one embodiment of the present disclosure.

In FIG. 3, a resist layer 308 is formed over the CNTs 206 and patterned to form a pattern 310 for the formation of electrical contacts (to define a length $L_{cont}$ for the contacts) for an FET device to be formed using the CNTs 206 as a channel for the device. The pattern 310 also defines a channel length ($L_{ch}$). The resist layer 308, in one embodiment, comprises a hydrogen silsesquioxane (HSQ) resist layer 308. HSQ is easily patterned using e-beam lithography, which converts the HSQ to SiO2, and can be easily removed with known etching techniques. However, other resist or dielectric materials can be employed instead of HSQ. The resist layer 308 can be deposited by a spin coat process and patterned with e-beam lithography. The resist layer 308 is reduced to SiO2 after e-beam exposure to form contact openings 312 ($L_{cont}$) after an etched process. The openings 312 define locations for metal contacts, which function as sources and drains for the CNT FET to be formed.

Figure 4:
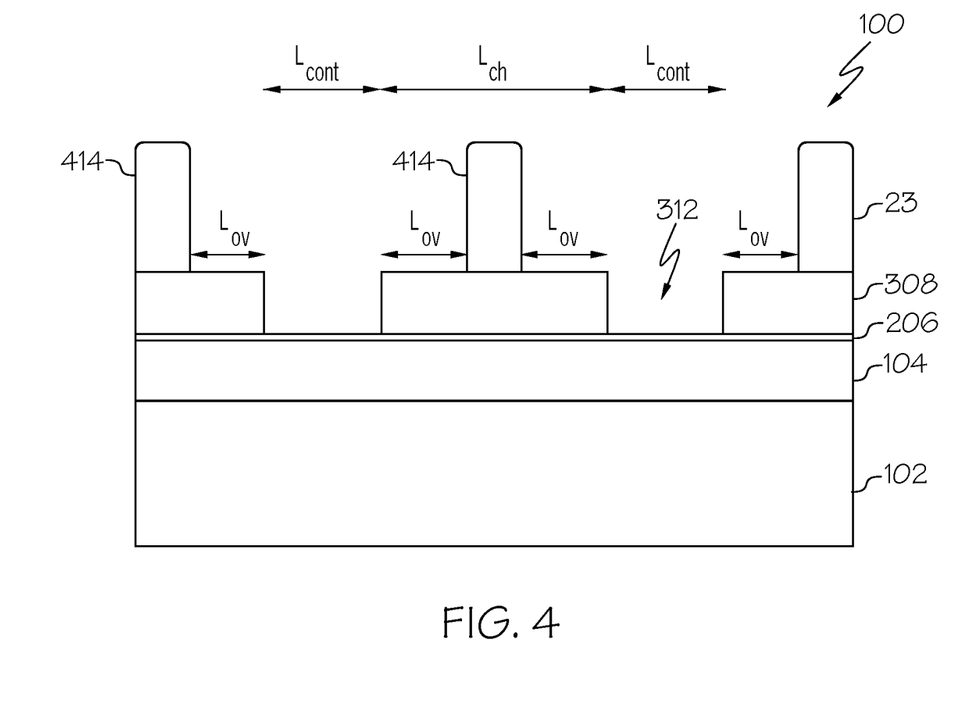
FIG. 4 is a cross-sectional view for the semiconductor device of FIG. 3 showing a second resist patterned on the first resist according to one embodiment of the present disclosure.

A second resist material is then deposited (e.g., spun on) and patterned over the resist layer 308 to form a second resist layer 414, as shown in FIG. 4. The pattern of the second resist layer 414 is to be employed in a liftoff process for metal contact formation. The second resist material, in one embodiment, comprises polymethyl methacrylate (PMMA) or other resists that can be employed in a liftoff process. The resist material can be patterned using e-beam lithography. Since it is challenging to define a PMMA pattern with exactly the same openings as the underlying HSQ pattern, a small overlap ($L_{ov}$), in one embodiment, is defined to accommodate possible misalignment with the openings 312 in the first resist layer 308.

Figure 5:
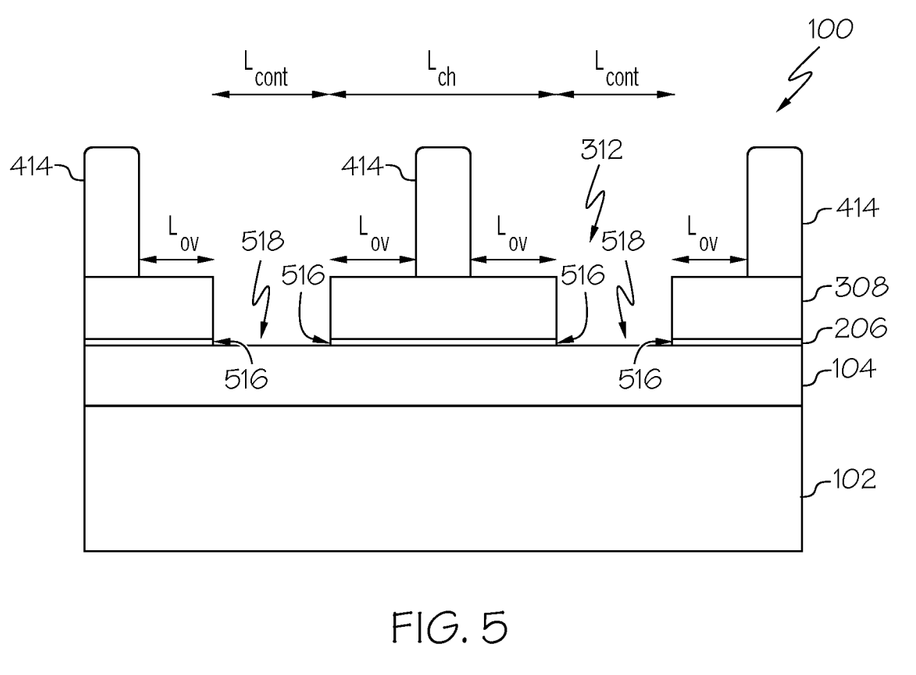
FIG. 5 is a cross-sectional view for the semiconductor device of FIG. 4 showing the carbon nanotubes exposed within the openings having been etched away and a portion of the underlying dielectric layer being exposed according to one embodiment of the present disclosure.

An etching process is performed to etch away the CNTs within the openings (contact areas) 312, as shown in FIG. 5. This etching process exposes tips 516 of the CNTs 216 and a portion 518 of the dielectric layer 104 within the openings 312, as shown in FIG. 5. In one embodiment, the etching process is a dry-etch process such as oxygen reactive ion etching. It should be noted that the etching condition are carefully tuned to fully etch away the CNTs within the openings (contact areas) 312 and expose tips 516 of the CNTs 216 for making end-bonded contacts, while creating minimum undercut below the first resist 308. For this purpose, a highly directional dry etching method, in one embodiment, is utilized.

Figure 6:
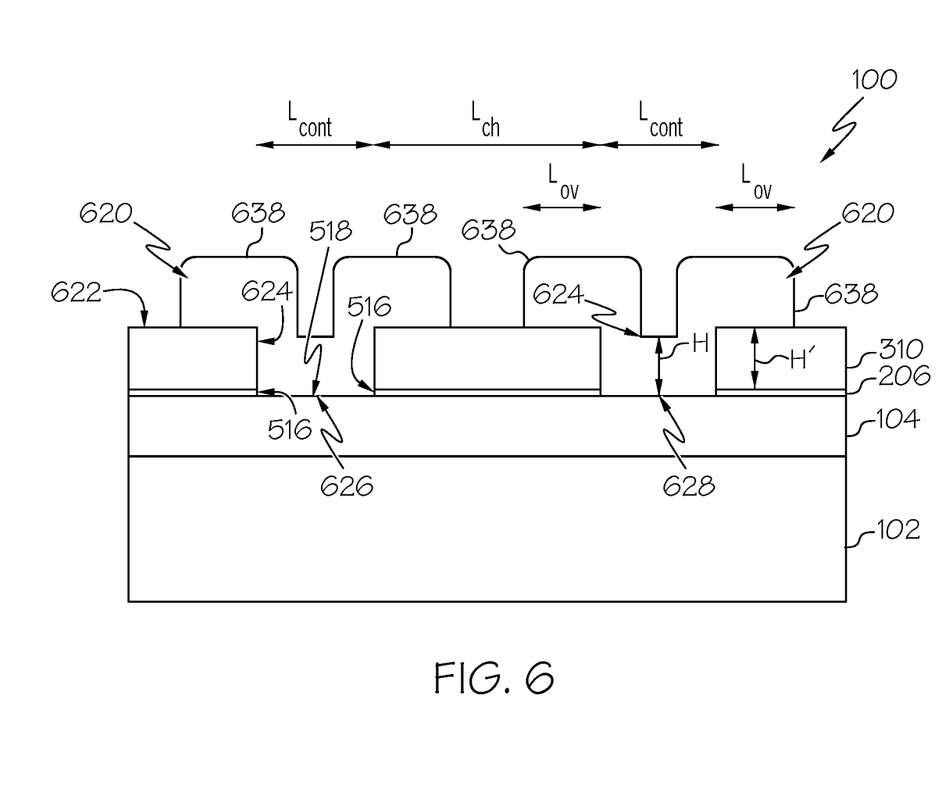
FIG. 6 is a cross-sectional view for the semiconductor device of FIG. 5 showing metal contacts formed through on the second resist layer using a liftoff process according to one embodiment of the present disclosure.

After the etching process has been performed, metal contacts 620 are formed in the openings 312, as shown in FIG. 6. The metal material for contacts 620 is formed by depositing the contact material within the openings 312 and over and in contact with the first resist layer 308 in the overlap regions ($L_{ov}$), the second resist layer 414 (e.g., PMMA), the exposed CNT tips 516, and the exposed portions 518 of the dielectric layer 104. The metal deposition process can comprise any suitable deposition process, e.g., sputtering, evaporation, CVD, etc.

Then, a liftoff process is performed to breakdown the second resist layer 414 and remove the metal from over the second resist layer 414. The metal remaining in the openings 312 and the overlap regions ($L_{ov}$) forms the contacts 620. The contacts 620 are in contact with a top surface 622 of the first resist layer 308 in the overlap regions, a vertical sidewall 624 of the first resist layer 308 in the overlap regions, the exposed tips 516 of the CNTs 216 resulting from the etching process, and the exposed portions 518 of the dielectric layer 104. In one embodiment, a thickness or height h of at least a portion 624 of the contacts 620 defined by length $L_{cont}$ and in contact with the vertical sidewall 624 of the first resist layer 308, the exposed tips 516 of the CNTs 206, and the exposed portions 518 of the dielectric layer 104 is equal to or less than a thickness or height h' of the first resist layer 308.

The metal for the contacts 620, in one embodiment, comprises scandium (Sc), erbium (Er), lanthanum (La), yttrium (Y), calcium (Ca), gadolinium (Gd), titanium (Ti) or other suitable n-type materials for NFETs. In some embodiments, the CNT tips 516 are oxidized from being exposed to air or oxygen. In these embodiments, the metal for the contacts 620 metal is able to scavenge oxygen the oxidized CNT tips 516 for a bonding (e.g., a Sc—C bonding) to provide the electrical contacts. The contacts 620 function as source and drain regions for FET devices 626, 628 formed with the CNT 206 as the device channel.

Figure 7:
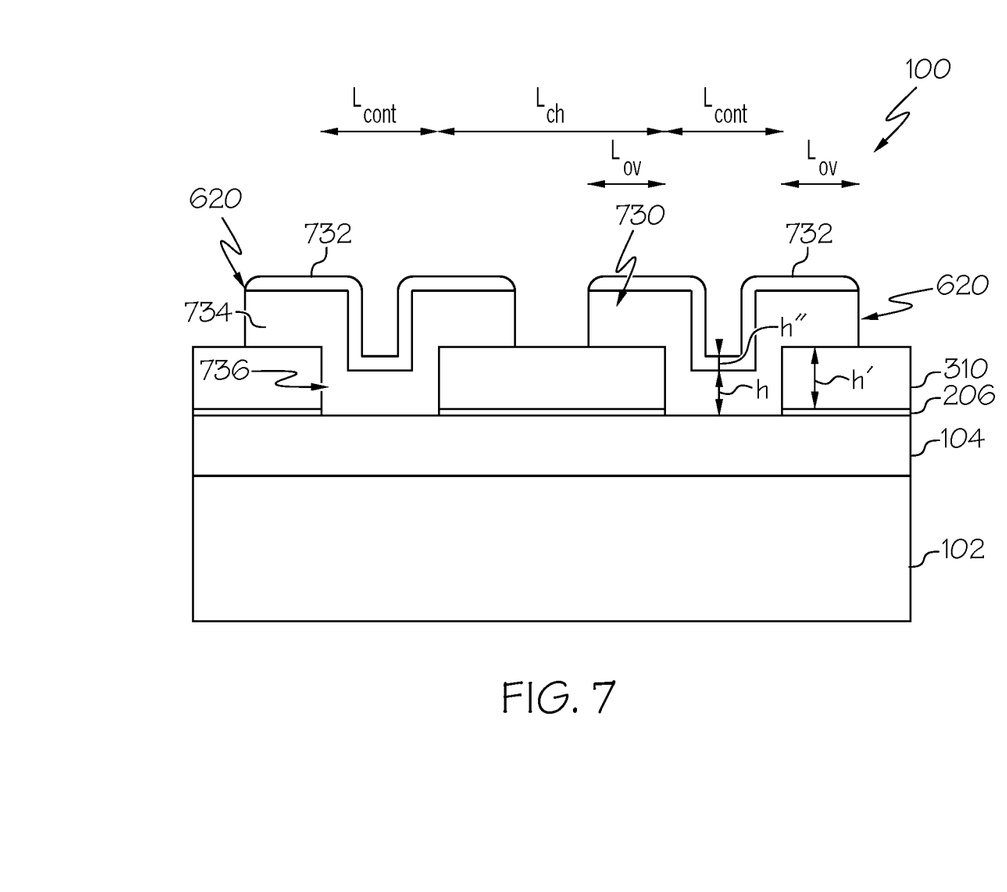
FIG. 7 is a cross-sectional view for the semiconductor device of FIG. 6 showing a bilayer of the metal contacts according to one embodiment of the present disclosure.

In one embodiment, the contacts 620 comprise a bilayer of metal materials, as shown in FIG. 7. The bilayer comprises an n-type material 730 followed by a protective material 732. For example, the n-type material 730 comprises a Sc, Er, La, Y, Ca, Gd, or Ti layer (n-type metal) followed by a layer 732 of, for example, gold (Au), platinum (Pt), or other inert highly conductive material (protective metal). The inert highly conductive material 732, in one embodiment, is formed to protect a top surface 734 of the contacts 620 while the first resist layer 308 protects the sidewalls 736 of the contacts 620. The inert highly conductive material 732 is deposited immediately after the first metal for the contacts 620 and is patterned using the same liftoff process. Here, inert particularly refers to resistance to oxidation but protection from other reactants is also included. In one embodiment, a height h of the n-type material within the contact openings 312 is less than a height h' of the first resist layer 308. A height h" of the inert highly conductive material 732 comprises a dimension that is greater than, for example, 10 nm and allows the material 732 to be lifted off with n-type metal.

Returning to FIG. 6, to further protect the contacts 620 from oxidation, the contacts 620 extend over the first resist layer 308 in the overlap regions ($L_{ov}$) to further protect sidewalls 736 of the contacts 620 (in contact with the first resist layer 308). Extension portions 638 of the contacts 620 prevent oxidation of the contact at or near the CNT layer 206. The extension portions 638 also reduce contact resistance.

Figure 8:
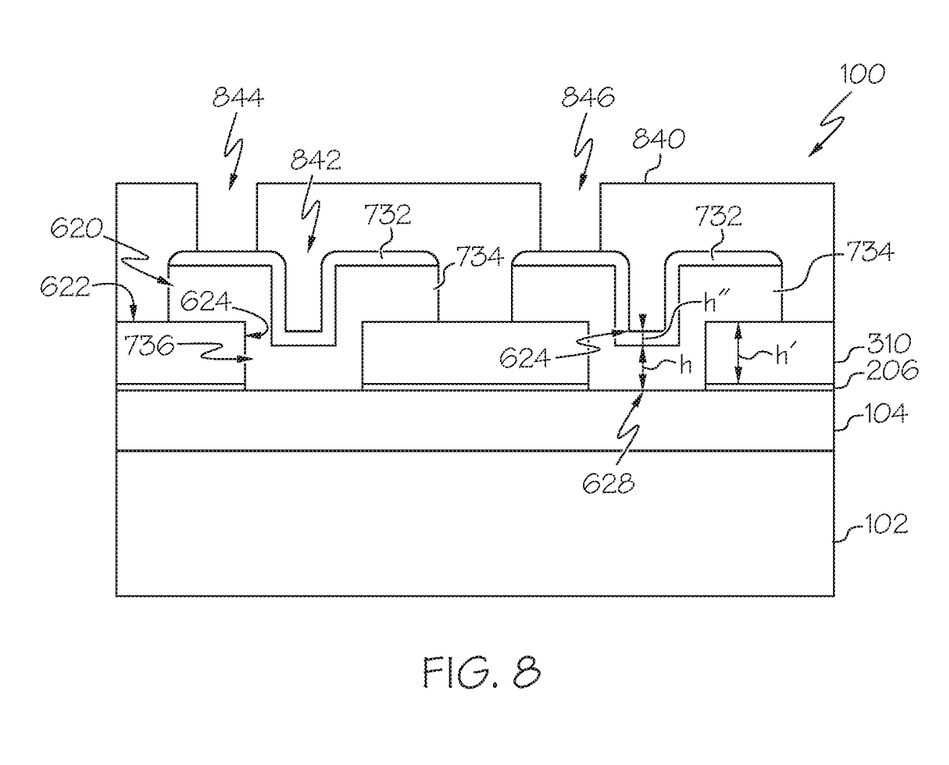
FIG. 8 is a cross-sectional view for the semiconductor device of FIG. 6 showing a dielectric layer formed over the metal contacts according to one embodiment of the present disclosure.

FIG. 8 shows that a dielectric material 840 is formed over the devices 626, 628. The dielectric layer 840, in one embodiment, is employed for forming vias and other metallizations to connect to the contacts 620. The dielectric material 840 can be formed using an atomic layer deposition (ALD) process, although other deposition processes may be employed. A pad open process can be employed to form openings 842, 844 through dielectric material 840 to access the contacts 620 in a trench 842 formed in the contacts 620 or on the contact extensions 638. Additional metals can be formed to make connections to the contacts 620 through the openings (contact windows) 844, 846. In one embodiment, the dielectric material 840 includes aluminum oxide ($Al_2O_3$) deposited using ALD and patterned using lithography to form contact windows.

The completed device 100, in one embodiment, is an NFET device. In particularly useful embodiments, the channel length ($L_{ch}$) can be between about 200 nm and 300 nm and nominally about 250 nm. The contact length ($L_{cont}$) can be between about 30 nm and 1200 nm. The overlap length ($L_{ov}$) can be about 40 nm to about 60 nm, nominally about 50 nm. While the present dimensions are provided, these dimensions are not to be construed as limiting as other dimensions may be employed in accordance with the present principles.

In tests performed in accordance with the present principles, the device transfer characteristics were measured on CNT NFETs with end-bonded n-type contacts. In one particular study, CNT NFETs with small Sc end-bonded contacts ($L_{cont}$=40 nm) showed a high device yield (94%) and about the same on current level as NFETs with big Sc end-bonded contacts ($L_{cont}$=300 nm). In a comparison study, CNT NFETs with conventional Sc side contacts showed apparent contact length dependence for both on current and device yield, which degraded dramatically for small Sc side contacts ($L_{cont}$=40 nm) compared with big Sc side contacts ($L_{cont}$=300 nm).

Figure 9:
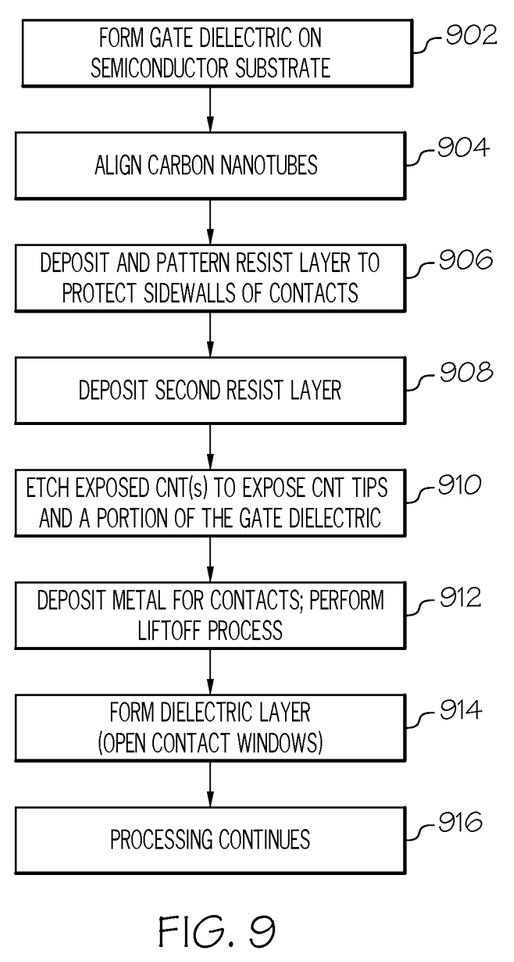
FIG. 9 is an operational flow diagram showing methods for forming a CNT field effect transistor in accordance with illustrative embodiments.

Referring to FIG. 9, methods for forming FETs are shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 902, a gate dielectric is formed on a semiconductor substrate. The gate dielectric layer may include a grown or deposited dielectric material. The dielectric material may include an oxide, such as a silicon oxide or a high-k dielectric material such as, e.g., $Al_2O_3$. Other gate dielectrics may also be employed. The semiconductor substrate may include any suitable semiconductor material that can be doped to form a gate electrode. In some embodiments, the gate electrode can be a patterned metal electrode that has a top surface planarized for high speed switching. The gate electrode (metal) would be formed corresponding to the channel region ($L_{ch}$).

In block 904, carbon nanotubes are aligned on the dielectric layer. The carbon nanotubes may be placed on the dielectric layer or may be formed on the dielectric layer. The carbon nanotubes are aligned to form a channel region for a FET to be formed.

In block 906, a first resist layer is deposited (e.g., by a spin on process) on the carbon nanotubes. The first resist layer is patterned to form openings therein. The patterning of the first resist layer may include electron beam lithography, although other patterning processes may be employed. The patterned first resist layer may include hydrogen silsesquioxane (HSQ) or other resist material. The portions of the HSQ to be kept may be irradiated using an electron beam, which alters the material. The HSQ can be converted to silicon oxide (e.g., silicon dioxide) by the electron beam. The unexposed HSQ resist may then be removed using an etching process to form the pattern.

The patterning of the first resist layer defines a channel length ($L_{ch}$) and contact lengths ($L_{cont}$) of the metal contacts by forming portions of the first resist layer to protect portions of the carbon nanotubes underlying the first resist layer.

In block 908, a second resist layer is formed and patterned on the first resist layers. The second resist layer and the first resist layer combine to provide a patterned shape for forming source and drain contacts. The second resist pattern is offset from end portions of the first resist. The second resist layer is employed as a liftoff resist.

In block 910, an etching process is performed to etch away exposed CNTs. This etching process exposes tips of CNTs under the first resist layer and a portion of the dielectric layer adjacent to the patterned first resist layer within the openings shown in FIG. 5.

In block 912, metal contacts are deposited on the carbon nanotubes in the openings in the patterned first resist layer and over the patterned first and second resist layers. A liftoff process is preformed to remove the second resist pattern to shapes the contacts. The contacts have sidewalls protected by the first resist layer and comprise contacts to prevent degradation of the metal contacts over the CNT in the openings. The liftoff process removes metal from regions where the second resist was formed.

The metal contacts, in one embodiment, are an n-type metal to form the metal contacts. In one embodiment, the resist for the liftoff process is formed. Then, the n-type metal (e.g., Sc or Er) is deposited over the liftoff resist. Then, a protective metal (e.g., Au) is formed on the n-type metal. Then, in accordance with the liftoff process, the liftoff resist is removed forming the metal contacts.

In block 914, a dielectric material can be formed over the patterned metal contacts. The dielectric material covers the metal contacts and can be patterned to open contact windows. The dielectric layer can be formed using an ALD process although other formation processes can be employed. The dielectric layer can be patterned using a pad open process (lithography).

In block 916, processing may continue to complete the transistor device. This can include forming interlevel dielectric layers, self-aligned contacts, vias, and other metallizations, etc.

Although specific embodiments of the disclosure have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A field effect transistor comprising:
   a substrate;
   a gate dielectric formed on the substrate;
   a channel material formed on the gate dielectric, the channel material comprising carbon nanotubes; a patterned resist layer comprising openings formed therein, the openings exposing portions of the gate dielectric and end portions of the carbon nanotubes under the patterned resist layer, wherein exposed tips of the carbon nanotubes at the end portions are oxidized, and wherein the patterned resist layer comprises hydrogen silsesquioxane;
   metal contacts formed at least within the openings, the metal contacts comprising a portion contacting the oxidized exposed tips of the carbon nanotubes and the portions of the gate dielectric exposed within the openings, wherein the portion of the metal contacts contacting the oxidized exposed tips of the carbon nanotubes scavenge oxygen from the oxidized exposed tips of the carbon nanotubes forming a bond between material of the metal contacts and the carbon nanotubes, where the portion of the metal contacts comprises a bottom surface that is planar with a bottom surface of the end portions of the carbon nanotubes, and wherein a region of the portion of the metal contacts comprises a top surface that is above a bottom surface of the patterned resist layer and disposed between sidewalls of the patterned resist layer, and wherein the top surface is planar with or below a top surface of the patterned resist layer; and a dielectric layer comprising a planar top surface, wherein the dielectric layer is formed in contact with a plurality of portions of a top surface of the patterned resist layer, a plurality of sidewalls of each of the metal contacts, and the top surface of the region of the portion of each of the metal contacts.

2. The field effect transistor of claim 1, wherein the top surface of the region of the portion of the metal contacts is planar with the top surface of the patterned resist layer and below a top surface of one or more other portions of the metal contacts.

3. The field effect transistor of claim 1, wherein the metal contacts comprise an n-type metal.

4. The field effect transistor of claim 3, wherein the n-type metal comprises one of Sc, Er, La, Y, Ca, Gd, and Ti.

5. The field effect transistor of claim 1, wherein the patterned resist layer comprises a resist material having a chemical structure that changes when irradiated by an electron beam.

6. The field effect transistor of claim 1, wherein the metal contacts comprise an n-type metal and a protective inert metal.

7. The field effect transistor of claim 1, wherein the metal contacts further comprise an additional portion extending over and in contact with a top surface of a portion of the patterned resist layer.

8. The field effect transistor of claim 1, wherein the bottom surface of the patterned resist layer only contacts the top surface of the carbon nanotubes.

9. A field effect transistor comprising:
a semiconductor substrate;
a gate dielectric formed on the semiconductor substrate;
carbon nanotubes formed on the gate dielectric, the carbon nanotubes forming a channel;
a patterned resist layer formed over and in contact with the carbon nanotubes, the patterned resist comprising openings formed therein, the openings exposing portions of the gate dielectric and end portions of the carbon nanotubes situated under the patterned resist layer, wherein exposed tips of the carbon nanotubes at the end portions of the carbon nanotubes are oxidized, and wherein the patterned resist layer comprises hydrogen silsesquioxane;
n-type metal contacts formed at least within the openings, the n-type metal contacts comprising a portion contacting the oxidized exposed tips of the carbon nanotubes and the portions of the gate dielectric exposed within the openings, wherein the portion of the metal contacts contacting the oxidized exposed tips of the carbon nanotubes scavenge oxygen from the exposed tips to form a bond between material of the metal contacts and the carbon nanotubes, where the portion of the metal contacts comprises a bottom surface that is planar with a bottom surface of the end portions of the carbon nanotubes, and wherein a region of the portion of the n-type metal contacts comprises a top surface that is above a bottom surface of the patterned resist layer and disposed between sidewalls of the patterned resist layer, and wherein the top surface is planar with or below a top surface of the patterned resist layer; and
a dielectric material patterned over the n-type metal contacts and the patterned resist layer, the dielectric material comprising contact widows exposing at least a portion of the n-type metal contacts, wherein the dielectric material is formed in contact with a plurality of portions of a top surface of the patterned resist layer, a plurality of sidewalls of each of the n-type metal contacts, and the top surface of the region of the portion of each of the n-type metal contacts.

10. The field effect transistor of claim 9, wherein the top surface of the region of the portion of the n-type metal contacts is planar with the top surface of the patterned resist layer and below a top surface of one or more other portions of the n-type metal contacts.

11. The field effect transistor of claim 9, wherein the n-type metal contacts comprise one of Sc, Er, La, Y, Ca, Gd, and Ti.

12. The field effect transistor of claim 9, further comprising:
a protective inert metal formed over the n-type metal contacts.

13. The field effect transistor of claim 9, wherein the n-type metal contacts further comprise an additional portion extending over and in contact with a top surface of a portion of the patterned resist layer.

14. A method for forming a field effect transistor, the method comprising:
forming a gate dielectric on a semiconductor substrate;
aligning carbon nanotubes on the gate dielectric;
patterning a first resist layer to form openings therein, the openings exposing a portion of the carbon nanotubes, wherein the first resist layer comprises hydrogen silsesquioxane and the patterning converts portions of the hydrogen silsesquioxane to silicon oxide, wherein the portions of the hydrogen silsesquioxane that have been converted to silicon oxide are subsequently removed to form the openings within the first resist layer;
forming a second resist layer on the patterned first resist layer;
patterning the second resist layer, wherein the patterning exposes portions of the patterned first resist layer;
after the second resist layer has been patterned, etching the portion of carbon nanotubes exposed within the openings, the etching exposing and oxidizing tips of the carbon nanotubes under the first resist layer and portions of the gate dielectric; and
forming metal contacts at least within the openings, the metal contacts comprising a portion contacting the oxidized tips of the carbon nanotubes under the first resist layer, the portions of the gate dielectric, and a portion of the first resist layer,
wherein the forming comprises forming a bottom surface of the portion of the metal contacts planar with a bottom surface of the end portions of the carbon nanotubes, and
wherein the forming further comprises forming a region of the portion of the metal contacts with a top surface that is above a bottom surface of the first resist layer and disposed between sidewalls of the first resist layer, and wherein the top surface is further formed planar with or below a top surface of the first resist layer;
removing the patterned second resist layer after the metal contacts have been formed; and
forming a dielectric layer comprising a planar top surface, wherein the dielectric layer is formed in contact with a plurality of portions of a top surface of the first patterned resist layer, a plurality of sidewalls of each of the metal contacts, and the top surface of the region of the portion of each of the metal contacts.

15. The method of claim 14, further comprising:
forming at least a portion of the metal contacts over and in contact with a top surface of the first resist layer.

16. The method of claim 14, wherein forming the metal contacts comprises depositing an n-type metal and forming the metal contacts from the n-type metal.

17. The method of claim 14, further comprising:
forming a protective metal layer over and in contact with the metal contacts.

18. The method of claim 14, wherein at least a portion of the metal contacts formed within the openings is formed with a height being less than a height of the first resist layer.

* * * * *